United States Patent [19]

Monroe

[11] 4,160,936
[45] Jul. 10, 1979

[54] FAST-START VERTICAL CURRENT FEEDBACK CIRCUIT

[75] Inventor: Tex K. Monroe, Batavia, N.Y.

[73] Assignee: GTE Sylvania Incorporated, Stamford, Conn.

[21] Appl. No.: 860,148

[22] Filed: Dec. 14, 1977

[51] Int. Cl.² .................. H01J 29/70; H01J 29/72
[52] U.S. Cl. .................. 315/388; 315/389; 315/393
[58] Field of Search ............ 315/387, 388, 389, 393, 315/408

[56] References Cited

U.S. PATENT DOCUMENTS

| 3,758,814 | 9/1973 | Tang | 315/389 |
| 3,947,723 | 3/1976 | Thompson | 315/389 |
| 4,054,816 | 10/1977 | Keidl | 315/387 |

Primary Examiner—Theodore M. Blum
Attorney, Agent, or Firm—John A. Odozynski

[57] ABSTRACT

A vertical deflection amplifier includes a preamplifier having an input at which is applied a DC feedback signal for the stabilization of the amplifier's DC output. In order to assure an undistorted or unattenuated vertical deflection upon initial turn-on of the receiver, a fast-start circuit superimposes a transient voltage on the DC feedback signal. The fast-start circuit allows the amplifier's output to reach its quiescent DC output level in a period of time that is substantially shorter than the time constant of a sampling network from which the DC feedback signal is derived.

8 Claims, 4 Drawing Figures

FAST-START VERTICAL CURRENT FEEDBACK CIRCUIT

FIELD OF THE INVENTION

This invention relates to vertical deflection circuitry for television receivers and more particularly to circuits for effecting fast-start of the vertical scan, thereby circumventing problems associated with a distorted or collasped vertical deflection signal.

BACKGROUND OF THE INVENTION

In his application for a "Constant-Current Vertical Amplifier," Ser. No. 838,549, filed Oct. 3, 1977, the applicant discloses, inter alia, a circuit using a commercially available operational amplifier (op-amp) in a vertical deflection system. One of the advantages of that system is that the op-amp operates from a single rather than dual, -polarity voltage supply. However, in order to assure the maximum undistorted deflection output, it is necessary that the DC output of the op-amp be maintained at approximately one-half the supply voltage. This can be achieved by applying an appropriate DC voltage at the op-amp's noninverting input and applying substantial DC feedback between the amplifier's output and its inverting input. However, in circuits where it is necessary to apply the DC feedback through a long time-constant network, in order, for example, to maintain the op-amp's stability or noise immunity, the voltage at the op-amp's inverting input may not reach its quiescent level until an undesirable length of time has elapsed. During this time the op-amp's DC output will be sufficiently different fom one-half the supply voltage so that the vertical deflection output will be either distorted or collapsed. Disclosed herein is circuitry that assures that the DC voltage at the amplifiers inverting input reaches its quiescent level in a substantially shorter period of time.

SUMMARY OF THE INVENTION

A vertical deflection amplifier includes a preamplifier having an input at which is applied a substantially DC feedback signal in order to stabilize the amplifier's DC voltage output level. The feedback signal is derived from the amplifier's output and applied to the preamplifier's input terminal from a sampling network that is characterized by a time-constant substantially longer than the vertical scan rate. The amplifier represents an improvement over the prior art to the extent that it incorporates a fast-start circuit that superimposes a transient voltage on the feedback signal so that the amplifier's DC output reaches its quiescent level within a length of time substantially shorter than the sampling network time-constant.

OBJECTS OF THE INVENTION

It is an object of this invention to provide a DC-stabilized vertical deflection amplifier.

It is a further object of this invention to avoid a collapsed or distorted vertical scan upon initial turn-on of the television receiver.

It is a further object of this invention to avoid such effects by incorporating a fast-start circuit so that the amplifier reaches its quiescent DC output level in a length of time substantially shorter than the vertical deflection period.

DESCRIPTION OF THE PREFERRED EMBODIMENT

For a better understanding of the present invention, together with other and further objects, advantages and capabilities thereof, reference is made to the following disclosure in conjunction with the accompanying drawings.

Figure 1:
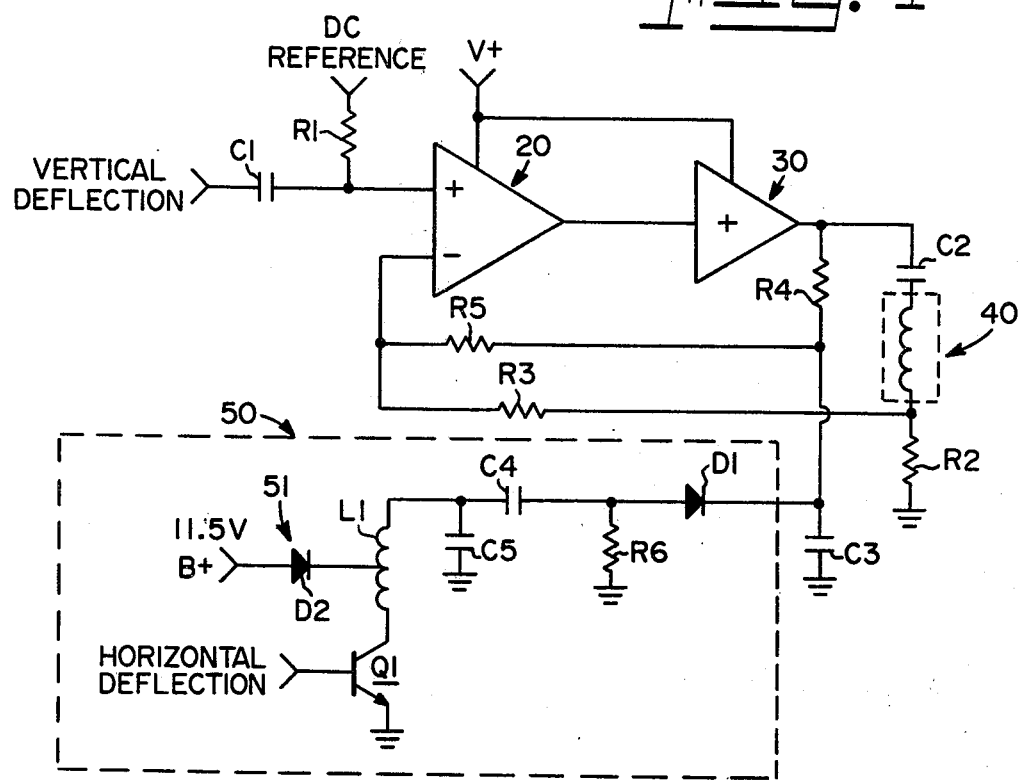
FIG. 1 is a schematic diagram of a vertical deflection amplifier incorporating the subject invention.

As illustrated in FIG. 1, a vertical deflection amplifier used in conjunction with the instant invention comprises a preamplifier 20 having a non-inverting (+) input and inverting (−) input. An AC, that is, vertical deflection, signal may be coupled through a capacitor C1 and a DC reference signal coupled through a resistor R1 to the non-inverting input.

The output of the preamplifier is coupled to the input of a power amplifier 30. The power amplifier provides current amplification of the signal developed by the preamplifier. The output of the power amplifier is then AC coupled through a capacitor C2 to a deflection yoke 40. The yoke is coupled through a feedback resistor R2 to circuit ground. In a manner fully described in the U.S. Patent application cited above, the feedback resistor develops a voltage indicative of the yoke current. This voltage is then coupled through a resistor R3 to the preamplifier's inverting input so that the yoke current waveform is a desired replica of the vertical deflection signal.

In order to maintain the preamplifier's DC output at approximately $\frac{1}{2}V+$, thereby assuring a maximum undistorted yoke current swing, a substantially DC feedback signal is supplied to the preamplifier noninverting input. The feedback signal is developed by a sampling network comprising the series-connected resistor R4 and capacitor C3, coupled from the power amplifier output to circuit ground. R4 and C3 provide a signal that is proportional to the DC RMS output of the power amplifier. The DC feedback signal is coupled through a resistor R5 to the preamplifier's inverting input. The preamplifier is characterized by very high DC gain so that any difference between the DC reference and the feedback signal is amplified in a fashion so as to maintain the amplifier DC output at approximately $\frac{1}{2}V+$.

However, in order to minimize ripple on the feedback signal and the subsequent linearity distortion of the yoke current waveform, it is necessary that the time-constant established by R4 and C3 be much longer than the period of the vertical deflection signal. For example, with values of R4 and C3 equal to 56 K ohms and 4.7 microfarads respectively, the sampling network will have a time-constant of approximately 0.263 seconds. The period of the vertical deflection signal is, of course, 1/60 second. As a result, when the television receiver is initially turned on, it will be necessary for C3 to be charged to its quiescent operating level in order for the preamplifier's DC output to approach the desired value. Because the time-constant of the sampling network is much longer than the vertical deflection period, and because R4 and C3 must charge through several time constants before the voltage is sufficient for vertical scan to start, many vertical deflection cycles will have passed before this occurs. During this time the preamplifier's very high DC gain will respond to the difference between the voltages at its inverting and noninverting inputs, that is, the difference between the DC reference signal and the voltage on C3. Because the DC reference signal will be much greater, the amplifier will be driven toward saturation and the vertical scan will be distorted or collapsed. In addition to delaying the time at which a viewable image is available, the collapsed vertical scan could, under some conditions, result in damage to the picture tube. A fast-start circuit 50 circumvents these effects.

The fast-start circuit comprises a source of substantially instantaneous voltage 51 consisting of a transistor $Q_1$ having a base electrode coupled to a source of horizontal deflection signals and a collector electrode connected to one end of an inductive element L1. In practice L1 may conveniently consist of a winding on the horizontal flyback transformer. The other end of L1 is coupled through a capacitor L5 to circuit ground. L1 is tapped through a diode D2 to a source of D1 potential B+. In this particular embodiment B+ is 11.5 volts. Although, as described herein, the source of instantaneous voltage may be derived from the horizontal deflection circuitry, many alternate sources may be derived from other portions of the television receiver.

Source 51 is coupled through a capacitor C4 and a diode D1 to the junction of R4 and C3. The anode of D1 is coupled through a resistor R6 to circuit ground.

Figure 2A:
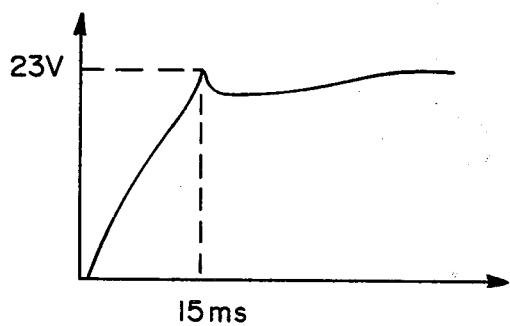
FIGS. 2A-2C depict waveforms developed by the fast-start circuit.
Figure 2B:
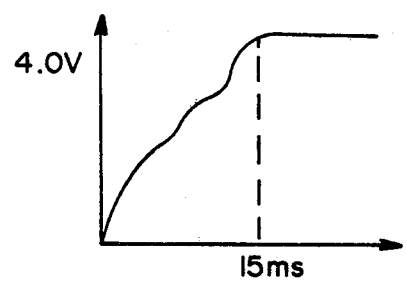

Operation is as follows. Subsequent to the energization of the television receiver, the voltage at the junction of L1 and C4 rises substantially instantaneously to approximately 23 volts, as shown in FIG. 2A. This voltage is AC coupled through C4 to the anode of D1. D1 becomes conductive and, depending on the values of C4 and C3, C3 is rapidly charged to a value substantially equal to its nominal quiescent DC operating value. Those skilled in the art are aware that the proper value of C4 is determined by the rate of rise and the amplitude of the voltage provided by the voltage source 51, by the value of C3, and by the desired nominal quiescent voltage at the op-amps inverting input. With a value of C3 equal to 4.7 microfarads and the voltage waveform of FIG. 2A, a value of C4 equal to 5.0 microfarads results in 4.0 volts appearing across C3, as shown in FIG. 2B.

Figure 2C:
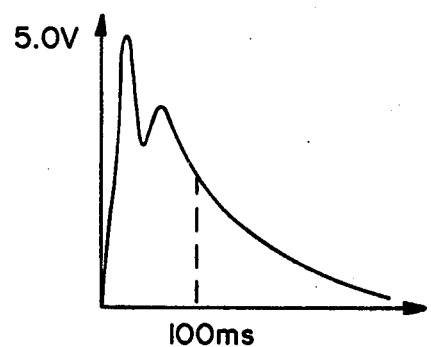

Because it is desirable that the amplifier's DC output be established by the voltage developed by the sampling network, it is preferable to disconnect the fast-start circuit from the sampling network, and from the preamplifier, once the initial turn-on period has elapsed. To this end R6 is provided so that C4 can be charged to a voltage equal to the voltage provided by source 51. Consequently, as shown in FIG. 2C, the voltage across R6, that is, the voltage at the anode of D1, decays from its initial value of approximately 4.7 volts subsequent at turn-on, to ground with a time-constant less than 100 milliseconds. D1 becomes back-biased and the fast-start circuit is effectively disconnected from the vertical deflection amplifier. The proper DC output of the preamplifier is now maintained by the sampling network.

In summary, the fast-start circuit uses a source of substantially instantaneous voltage, readily available from circuitry in the receiver, to develop a transient voltage that is superimposed on the DC feedback signal which is applied to the preamplifier's inverting input. After the initial energization of the receiver, the transient voltage decays sufficiently rapidly to allow the preamplifier's DC output to be stabilized and determined by the sampling network, which provides a feedback signal proportional to the deflection amplifier's RMS output.

Accordingly, while there has been shown and described what is at present considered to be the preferred embodiment of the invention, it will be obvious to those skilled in the art that various changes and modifications may be made therein without departing from the invention as defined by the appended claims.

What is claimed is:

1. In a vertical deflection amplifier including a preamplifier having an input at which is applied a substantially DC feedback signal for the stabilization of the amplifier's DC output, the feedback signal being derived fom the amplifier's output and applied to the input from a sampling network characterized by a time-constant substantially longer than the period of the amplifier's AC input signal, the improvement comprising:
   a fast-start circuit for superimposing a transient voltage on the feedback signal so that the DC output of the amplifier reaches a predetermined quiescent level within a length of time substantially shorter than the sampling network time-constant.

2. An improvement as defined in claim 1 wherein the fast-start circuit comprises a substantially instantaneous voltage source coupled to the sampling network through a series-connected capacitance and diode.

3. An improvement as defined in claim 2 wherein the capacitance and diode are connected by a resistance to ground so that the transient voltage decays to a level sufficient to back-bias the diode within a time less than the time-constant of the sampling network.

4. An improvement as defined in claim 3 wherein the voltage source comprises a transistor having a collector connected to one end of an inductive element, another end of the inductive element being connected to the series-connected capacitance and diode.

5. An improvement as defined in claim 4 wherein the transistor has a base connected to a source of horizontal deflection signals.

6. An improvement as defined in claim 5 wherein the sampling network comprises a capacitor coupled to the capacitor of the fast-start circuit so that the amplitude of the transient voltage is determined by the relative values of the two capacitors.

7. A vertical deflection amplifier utilizing a DC feedback signal for stabilizing the amplifier's DC output, comprising:
   an amplifier having an input at which is applied the DC feedback signal,
   a source of substantially instantaneous voltage;
   a series-connected capacitor and diode coupling the source of voltage to the amplifier's input so that the voltage at the amplifier's input reaches a predetermined value before the feedback signal attains its quiescent level.

8. A vertical deflection amplifier as defined in claim 7 further comprising a resistor coupling the series-connected capacitor and diode to ground so that the voltage across the resistor initially has a value approximately equal to the source of substantially instantaneous voltage and subsequently decays toward ground, thereby allowing the amplifier's DC output to be determined by the DC feedback signal.

* * * * *